United States Patent Office 3,264,220

Patented August 2, 1966

3,264,220

PHOTOENGRAVING

Stanley E. Kallenbach, Roslyn Heights, N.Y., assignor to Powers Chemco, Inc., Glen Cove, N.Y., a corporation of New York No Drawing. Filed Dec. 16, 1963, Ser. No. 330,657
5 Claims. (Cl. 252—156)

The present invention relates to a process for removing the resist layer from exposed zinc and copper photoengraving plates which have been provided with a photosensitive resist and which often have been exposed, burned-in and etched, so that the plates may be properly molded for stereotyping, or in the case of an unetched plate, the plate may be recoated for used as a new plate in photoengraving.

Objects and advantages of the invention will be set forth in part hereinafter and in part will be obvious herefrom, or may be learned by practice with the invention, the same being realized and attained by means of the steps, process and compositions pointed out in the appended claims.

The invention consists in the novel steps, process, compositions and improvements herein shown and described.

The present invention has for an object the provision of a novel and improved composition and process for removing protective enamel and resist coatings from metal plates, after the photosensitive resist coatings have been burned-in or after the enamel coating has become relatively insoluble and cannot be easily removed with usual solvents for the enamel coating. A further object is the provision of a novel and improved composition and process for the removal from the surface of a metal plate a layer of resist, protective or decorative enamel-like material, such as photosensitive resist, a lacquer, or an enamel. The present invention especially provides a novel and improved composition and process for the removal of a photosensitive resist, after exposure, burning-in and etching, from the surface of a photoengraved plate, such as a zinc or copper photoengraving.

In photoengraving, especially halftone photoengraving, the sheet of metal which is to be processed and made into a halftone photoengraving is provided with a carefully polished face and an unpolished back surface, the back surface being protected with a non-photosensitive resinous protective layer by which the back of the plate is protected again attack during the etching process. The thoroughly clean face of the plate is coated with a uniform layer of a photosensitive resist, which after drying is exposed to intense light beneath a halftone negative until portions of the resist have become insoluble while other portions remain soluble in the appropriate developer for the resist. After development, the plate may be etched in the conventional manner using a mordant such as an aqueous solution of nitric acid or ferric chloride.

After development and before etching, the resist-coated plate is "burned-in" where the photosensitive resist is a "hot-top enamel," and prior to using the photoengraved plate to form a stereotype matrix, the surface of the photoengraved plate is preferably freed of its resist layer. It is also important that as the surface of the photoengraved plate is freed of its resist layer that the back surface of the plate should not be freed of its resist layer, as the back resist layer is of a definite thickness, removal of which would affect the thickness of the finished plate, cause the production of an imperfect matrix and a stereotype plate made therefrom which would not form the best possible stereotype printing plate from the photoengraved plate. Thus, the selective removal of the burned-in exposed portions of the resist from the face of the plate, without removal of the protective coating on the back of the plate is of major importance.

Also, after exposure, development, and burning-in it often happens that some fault is found in the print on the metal surface, or for some other reason it is decided not to proceed further with etching or other processing of the partially finished zinc or copper plate. As metal plates of the grade used in photoengraving are relatively expensive, such unetched plates are often reclaimed. This work requires relatively great care, is a time consuming operation so that the highly polished surface will not be injured, and the plates cannot economically be cleaned by immersion in conventional cleaning solutions as these conventional cleaning solutions would remove the layer of resist protecting the back of the plate. Often, such solutions are of such a composition that they would also impair the highly polished surface of the face of the metal plate.

The present invention provides a simple, speedy, inexpensive and efficient method of removing the burned-in photosensitive resist from an etched zinc or copper photoengraving prior to the use of the photoengraving for the molding of a stereotype or other matrix, without contaminating the immersion bath and without deleteriously affecting the protective backing layer on the back side of the photoengraving. The invention further provides a novel and improved process and bath for the selective removal of the resist layer from the face of a photoengraving plate while leaving the usual backing layer substantially unaffected. Additionally, the present invention provides a simple, efficient method which economically effects the removal of protective layers of enamel, lacquer and hardened paint from metal surfaces without substantial effect on the metal surface under the protective layer, and without substantial contamination of the bath which causes the protective layer to be rendered susceptible to removal by subsequent rinsing of the plate in plain water after removal from the bath.

As used herein, the terms zinc and copper are used to include the sheets of relatively pure zinc and copper used in photoengraving as well as the zinc and copper base alloys which are similarly used.

It will be understood that the foregoing general description and the following detailed description as well are exemplary and explanatory of the invention but are not restrictive thereof.

The process and bath of the present invention are adapted for use with all of the conventional photoengraving resists such as gelatine, glue, shellac, polyvinyl alcohol and polyvinyl acetate, sensitized by chromic acid salts, such as ammonium chromate or ammonium bichromate and other chromic acid salts, but are less well suited for use with certain resists which are not photosensitized with chromic acid salts, such as the photosensitive cinnamoyl esters (e.g., Kodak "KPR"). Included among the various film forming colloids which are rendered differentially soluble by the action of chromic acid salts and light are: gelatine, glue, shellac, polyvinyl alcohols and acetates, and solutions of these various film-forming colloids with an appropriate chromic acid salt, or other photosensitive hardening agents, comprising the major portion of the photoengraving resists used in copper photoengraving.

The process and bath of the present invention also have usefulness in the removal of paint, lacquer and enamel coatings from the surface of various metal sheets and other objects. In this use, the bath and process are characterized by their ability to render the coating easily removable by rinse water, while avoiding disintegration of the coating while the coated metal object is immersed in the hot bath of the present invention. However, the principal and preferred use of the bath and process of the present invention is in the removal of the burned-in resist layer on the etched surface of a zinc photoengraving, so as to fully prepare the photoengraved plate for the matting process as the first step in the production of stereotypes.

The unpolished or back surface of photoengraving copper sheets is conventionally coated with a protective resist layer which is intended to protect the back of the plate against etching by the ferric chloride solution used in the etching of the face of the plate. This protective layer on the back of the plate conventionally consists of a thermosetting phenolic resin, although other impervious coatings which are not subject to attack by aqueous ferric chloride solutions are sometimes used, such as asphaltum varnish. Such protective coatings on the back of the plate are not resistant to many solutions, and especially to most alkaline solutions such as caustic solutions of potassium or sodium hydroxide in water. Organic solvents are not useful in the removel of the exposed, light-hardened areas of the conventional photosensitive resists, and some of the organic solvents attack the impervious layer on the back of the copper sheet.

Conventional solutions for removing the exposed burned-in resist on the plates cause the resist to be removed in the solution, thereby contaminating the solution and requiring it to be soon replaced.

Until the present invention, there has not been a practical solution which will selectively attack the exposed, developed or undeveloped photosensitive resist layer on the face of the plate while leaving the resist in place on the face of the metal sheet so that it may be removed by rinsing in plain water. Thereby, the resist does not contaminate the solution and it may be used over a long period of time.

The bath of the present invention is an aqueous solution consisting essentially of potassium carbonate and potassium hydroxide, the potassium carbonate being preferably present in a sufficient amount to saturate the solution as the solution is used, while the potassium hydroxide is present in an amount by weight of from 4% to 10%, based on the total weight of the solution.

The process of the present invention is carried out in the following manner:

The photoengraving plate with its exposed, burned-in photosensitive resist layer, either before or after etching has been performed, are immersed for a few minutes in the heated aqueous bath of potassium carbonate and potassium hydroxide, as set forth above. The bath preferably comprises an aqueous solution of at least 800 grams of potassium carbonate (calculated as anhydrous potassium carbonate) per liter, with from 4% to 10%, preferably about 8% by weight of total solution of potassium hydroxide. The maximum concentration of the potassium carbonate is, of course, its limit of solubility.

The bath is used at a temperature of from about 70° or higher, most preferably at about 80° to 100° C. At 80° C., with 8% potassium hydroxide in the potassium carbonate bath, about 6 minutes immersion of the plate to be cleaned is required, and immersion should not be continued beyond the time when the backing layer begins to be attacked, which attack occurs after about 12 to 13 minutes. At 95° C. an immersion of about 3 minutes in the saturated potassium carbonate bath containing 8% potassium hydroxide is sufficient to permit the subsequent washing away of the resist layer without attack on the impervious backing layer, although the backing layer may be seriously attacked if the time of immersion approximates or exceeds 7 minutes.

After immersion in the hot solution for the proper time, the plate is removed and rinsed front and back in cold water, which removes the exposed photosensitive resist on the face of the plate, while leaving the protective layer on the back of the plate substantially unimpaired. In general, the plate is then ready to be molded into a stereotype flong to produce a mat.

The bath and process of the present invention are also useful in stripping or removing protective layers of enamel, paint or lacquer from the surface of metal plates and other objects, thereby cleaning the metal plates and other objects and preparing them for reuse or for subsequent recoating. In such a use of the invention, the bath and process of the present invention have the advantage over conventional alkaline stripping baths in that the protective layer is not removed in the bath, but is removed when the metal object is subsequently washed, thereby prolonging the useful life of the bath.

Other alkali metal carbonates and hydroxides are not suitable for use with the present invention as they do not exhibit a sufficiently selective action on the photosensitized, burned-in resist layer as compared with their action on the non-photosensitive resist layer on the back of the plate.

When the concentration of the potassium carbonate in the solution is reduced substantially below saturation, the potassium hydroxide exhibits its normal tendency to attack the non-photosensitive protective coating on the back of the plate, thereby destroying the standard thickness of the etched plate so that an imperfect mat and stereotype plate result. Also, the exposed photosensitized resist layer tends to be removed in the bath rather than by the subsequent rinsing of the face and back of the plate, thereby also contributing to an earlier replacement of the bath.

The invention in its broader aspects is not limited to the specific steps, process and compositions shown and described but departures may be made therefrom within the scope of the accompanying claims without departing from the principles of the invention and without sacrificing its chief advantages.

What is claimed is:

1. A process for removing the exposed photosensitized resist layer from a metal photoengraved plate which comprises immersing the exposed, photosensitive resist-coated plate in a hot bath consisting essentially of a saturated aqueous solution of potassium carbonate and from 4% to 10% by weight of potassium hydroxide, allowing the plate to remain in said heated solution for a short period of time, removing the plate and rinsing it in water to remove the exposed resist layer.

2. A process for removing a protective layer from a metal plate which comprises immersing the metal object having a protective layer thereon in a bath consisting essentially of a saturated aqueous solution of potassium carbonate and from 4% to 10% of potassium hydroxide heated to a temperature of from 80° to 95° C. for a short period of time, removing the object from the bath and rinsing it in water to remove the protective layer from the metal object.

3. A process for selectively removing the exposed photosensitive resist layer from one side of a metal photoengraved plate, the other side of which is protected against etching with a non-photosensitive resist layer, which comprises immersing the exposed, resist-coated plate in a heated bath, said bath consisting of a saturated aqueous solution of potassium carbonate and from 4% to 10% by weight of potassium hydroxide, allowing the plate to remain in said heated solution for a few minutes, removing the plate from the heated bath prior to destruction of the resist on said other side and rinsing the solution from said plate whereby the exposed photosensitive resist layer is removed.

4. A process as claimed in claim 3, in which the potassium hydroxide in the solution is about 8% by weight.

5. A process as claimed in claim 3 in which the solution is used at a temperature of from about 80° to 95° C.

References Cited by the Examiner

UNITED STATES PATENTS

| | | | |
|---|---|---|---|
| 1,548,465 | 8/1925 | Henry | 156—10 |
| 2,556,626 | 6/1951 | Meulendyke | 156—8 |
| 2,653,860 | 9/1953 | Meyer | 252—156 X |

OTHER REFERENCES

Bennett: The Chemical Formulary, Chem. Pub. Co., N.Y., (1943), vol. VI, page 388 relied on.

Lange's Handbook of Chemistry, published by Handbook Publisher's, Inc., Sandusky, Ohio (1939), pages 184 and 185 relied on.

LEON D. ROSDOL, *Primary Examiner.*

JULIUS GREENWALD, *Examiner.*

J. T. FEDIGAN, *Assistant Examiner.*